(12) United States Patent
Peng et al.

(10) Patent No.: US 12,148,854 B2
(45) Date of Patent: Nov. 19, 2024

(54) METHOD FOR PRODUCING A DOUBLE GRADED CDSETE THIN FILM STRUCTURE

(71) Applicants: CHINA TRIUMPH INTERNATIONAL ENGINEERING CO., LTD., Shanghai (CN); CTF SOLAR GMBH, Dresden (DE)

(72) Inventors: Shou Peng, Shanghai (CN); Xinjian Yin, Shanghai (CN); Ganhua Fu, Shanghai (CN); Daniele Menossi, Dresden (DE); Michael Harr, Kelkheim-Ruppertshain (DE); Bastian Siepchen, Dresden (DE)

(73) Assignees: China Triumph International Engineering Co., Ltd., Shanghai (CN); CTF Solar GmbH, Dresden (DE)

(*) Notice: Subject to any disclaimer, the term of this patent is extended or adjusted under 35 U.S.C. 154(b) by 352 days.

(21) Appl. No.: 17/629,576

(22) PCT Filed: Jul. 25, 2019

(86) PCT No.: PCT/CN2019/097601
§ 371 (c)(1),
(2) Date: Jan. 24, 2022

(87) PCT Pub. No.: WO2021/012241
PCT Pub. Date: Jan. 28, 2021

(65) Prior Publication Data
US 2022/0246786 A1    Aug. 4, 2022

(51) Int. Cl.
*H01L 31/18*    (2006.01)
*H01L 31/0296*    (2006.01)
(Continued)

(52) U.S. Cl.
CPC .... *H01L 31/1832* (2013.01); *H01L 31/02966* (2013.01); *H01L 31/065* (2013.01);
(Continued)

(58) Field of Classification Search
CPC ........... H01L 31/1832; H01L 31/02966; H01L 31/065; H01L 31/02963; H01L 31/073; Y02E 10/543
See application file for complete search history.

(56) References Cited

U.S. PATENT DOCUMENTS 11,563,138 B2 * 1/2023 Peng .................... C23C 14/541
2013/0104985 A1 * 5/2013 Korevaar ............ H01L 31/0328
136/260

(Continued)

FOREIGN PATENT DOCUMENTS

CN    102110722 A    6/2011
CN    106653946 A    5/2017
(Continued)

OTHER PUBLICATIONS

Shiya Wen, etal. "Rationally Controlled Synthesis of CdSexTel-x Alloy Nanocrystals and Their Application in Efficient Graded Bandgap Solar Cells" Nanomaterials, vol. 7, No. 380, Nov. 8, 2017 (Nov. 8, 2017), see Table.
(Continued)

*Primary Examiner* — David Vu
*Assistant Examiner* — Brandon C Fox
(74) *Attorney, Agent, or Firm* — IPRTOP LLC

(57) ABSTRACT

The present invention proposes a method to form a double-graded CdSeTe thin film. The method comprises providing a base substrate, forming a first $CdSe_wTe_{1-w}$ layer having a first amount w1 of selenium in it, forming a second $CdSe_wTe_{1-w}$ layer having a second amount w2 of selenium in it and forming a third $CdSe_wTe_{1-w}$ layer having a third
(Continued)

amount w3 of selenium in it. The second amount w2 lies in the range between 0.25 and 0.4, whereas each of the amounts w1 and w3 lies in the range extending from 0 to 1. According to the present invention, the energy gap in the first and the third $CdSe_wTe_{1-w}$ layers is equal to or higher than 1.45 eV and the energy gap in the second $CdSe_wTe_{1-w}$ layer lies in the range between 1.38 eV and 1.45 eV and is smaller than the energy gap in the first and the third $CdSe_wTe_{1-w}$ layers.

13 Claims, 6 Drawing Sheets

(51) Int. Cl.
    *H01L 31/065*     (2012.01)
    *H01L 31/073*     (2012.01)
(52) U.S. Cl.
    CPC ...... *H01L 31/02963* (2013.01); *H01L 31/073* (2013.01); *Y02E 10/543* (2013.01)

(56) References Cited

U.S. PATENT DOCUMENTS

2014/0373908 A1\* 12/2014 Duggal ................ H01L 31/073
    136/260
2016/0126395 A1\* 5/2016 Damjanovic ....... H01L 31/1864

FOREIGN PATENT DOCUMENTS

| CN | 107452834 A | 12/2017 | | |
|---|---|---|---|---|
| CN | 107658350 A | 2/2018 | | |
| CN | 108604614 A | 9/2018 | | |
| WO | WO-2018156698 A1 | \* | 8/2018 | ......... H01L 31/0296 |

OTHER PUBLICATIONS

Brandon I. MacDonald, et al. "Layer-by-layer Assembly of Sintered CdSexTel-x Nanocrystal Solar cells" ACS NAND, vol. 6, No. 7, Jun. 12, 2012 (Jun. 6, 2012), see pp. 6001-6002, figure 6A.

\* cited by examiner

METHOD FOR PRODUCING A DOUBLE GRADED CDSETE THIN FILM STRUCTURE

FIELD OF THE TECHNOLOGY

The present invention refers to a method for forming a CdSeTe thin film structure having a double gradient of Se. This method is preferably used for forming a part of a photoactive layer of a CdTe thin film solar cell.

BACKGROUND

In the state of the art, the CdTe solar cell has the following structure, wherein the layers are arranged in the mentioned sequence: a transparent conducting oxide layer (TCO) formed as front contact layer; a layer of cadmium sulfide (CdS) formed as a n-doped window layer; a layer of cadmium telluride (CdTe) being the p-doped photoactive layer; and a back contact layer to collect the charge carriers. The CdS layer and the CdTe layer form a p-n junction. The front contact layer and the back contact layer may also be formed as a layer stack comprising different layers of different materials.

CdTe has an energy gap in the range of 1.45 eV to 1.5 eV which corresponds to the absorption region very close to the maximum intensity of the irradiation spectrum of the sun and so the maximum photovoltaic conversion efficiency. However, the maximum efficiency of a solar cell is limited, because of the open circuit voltage and photo-generated current which depends on the energy gap of the photoactive layer, the conduction band offset between layers forming the p-n junction and charge carrier recombination effects at the interface of the photoactive layer to the back contact layer.

One approach for improving the efficiency of solar cells is to optimize the energy gap of the photoactive layer and the band bending at the interfaces of the photoactive layer to adjacent layers. This is described, for instance, for solar cells using absorber materials containing copper, zinc, tin and at least one of sulfur and selenium (CZTS/Se materials) in US 2017/0110606 A1. For copper indium gallium selenide solar cells (CIGS or CIS solar cells), this approach is disclosed in TW 201218898 A and in US 2014/0326317 A1. In any case, the energy gap is varied by varying the proportion of one or several elements within the material of the photoactive layer and forming a gradient in the composition of the photoactive layer.

The gradient is formed by depositing the photoactive layer using different evaporation processes differing in the raw materials evaporated and, optionally, in the temperature of the substrate. An optional temperature treatment step performed subsequently to the deposition processes, causes interdiffusion and reaction of atoms comprised in different deposited layers and eventually forming a continuous photoactive layer.

For CdTe thin film solar cells, a varying concentration of Se in the photoactive layer is described in US 2014/0360565 A1, wherein the Se concentration at the light incident side of the photoactive layer is larger than that at the back side of the photoactive layer. The Se atomic concentration in the photoactive layer varies in a range between 0.001 at % and 40 at %. The Se concentration gradient is formed by forming a Se source layer and a CdTe layer subsequently and introducing Se into the CdTe layer from the Se source layer, for instance by a temperature treatment process. Further, co-deposition of a Se source material and a CdTe material is described as a possible method for obtaining the desired Se gradient. It is further described that a first region of the photoactive layer has a band gap that is lower than a band gap of a second region of the photoactive layer, wherein the first region is disposed proximate to the front contact layer relative to the second region.

However, forming a CdTe containing photoactive layer with an optimized energy gap at both the front side and the back side and in the middle of the photoactive layer is complicated. Furthermore, including high amounts of Se into CdTe may lead to a phase change of the CdSeTe layer from zinc-blende structure to wurtzite structure having negative effects on the solar cell performance.

SUMMARY

Therefore, it is an object of the invention to provide a method for producing a CdSeTe thin film structure having an optimized energy gap throughout the whole thickness of the CdSeTe thin film.

This object is solved by a method according to the independent claim. Preferred embodiments are given in the dependent claims.

The method according to the invention comprises the steps of providing a base substrate, forming a first $CdSe_wTe_{1-w}$ layer on the base substrate, forming a second $CdSe_wTe_{1-w}$ layer on the first $CdSe_wTe_{1-w}$ layer and forming a third $CdSe_wTe_{1-w}$ layer on the second $CdSe_wTe_{1-w}$ layer. The first $CdSe_wTe_{1-w}$ layer has a first thickness d1 and a first amount w1 of selenium in it. The second $CdSe_wTe_{1-w}$ layer has a second thickness d2 and a second amount w2 of selenium in it, wherein the second amount w2 lies in the range between 0.25 and 0.4. The third $CdSe_wTe_{1-w}$ layer has a third thickness d3 and a third amount w3 of selenium in it. Each of the first amount w1 and the third amount w3 is equal to or larger than zero and smaller than or equal to 1 ($0 \leq w \leq 1$ and $0 \leq w3 \leq 1$). A maximum of the energy gap in the first $CdSe_wTe_{1-w}$ layer and a maximum of the energy gap in the third $CdSe_wTe_{1-w}$ layer are equal to or higher than 1.45 eV and larger than the energy gap in the second $CdSe_wTe_{1-w}$ layer which lies in the range between 1.38 eV and 1.45 eV. The maximum of the energy gap in the first and the third $CdSe_wTe_{1-w}$ layers is present at least in a region of the respective $CdSe_wTe_{1-w}$ layer being adjacent to a side of that $CdSe_wTe_{1-w}$ layer opposite to the second $CdSe_wTe_{1-w}$ layer. Other regions of the respective $CdSe_wTe_{1-w}$ layer may have an energy gap smaller than the mentioned value of 1.45 eV. In particular, the energy gap of portions of the first and the third $CdSe_wTe_{1-w}$ layers being in contact with the second $CdSe_wTe_{1-w}$ layer is equal to or lower than 1.45 eV such that, preferably, a continuous change in the energy gap (and not an abrupt change) is present at the interfaces of the second $CdSe_wTe_{1-w}$ layer to the first or the third $CdSe_wTe_{1-w}$ layer, respectively.

In the result, a CdSeTe thin film comprising the first, the second and the third $CdSe_wTe_{1-w}$ layers is formed, wherein the CdSeTe thin film has two gradients of selenium content and is therefore a double-graded CdSeTe thin film. One of the gradients is formed at a first side of the CdSeTe thin film, whereas the other gradient is formed at a second side of the CdSeTe thin film lying opposite to the first side. Light impinging on the CdSeTe thin film enters the CdSeTe thin film either at the first side or the second side. Within the second $CdSe_wTe_{1-w}$ layer lying in the middle of the CdSeTe thin film, the selenium content is essentially constant and lies in the range between 0.25 and 0.4, i.e. between 25% and 40% of the ratio Se/(Se+Te) in the $CdSe_wTe_{1-w}$ layer. Within the first and the third $CdSe_wTe_{1-w}$ layer, the selenium content may also be constant or may vary. In particular, it may continuously increase or decrease within the first or the third $CdSe_wTe_{1-w}$ layer from the first or second side of the CdSeTe thin film towards the second $CdSe_wTe_{1-w}$ layer. In the result, there may be continuous transitions between the selenium content in the first and the third $CdSe_wTe_{1-w}$ layer and in the second $CdSe_wTe_{1-w}$ layer.

The dependence of the energy gap of a $CdSe_wTe_{1-w}$ layer on the selenium content in it is well known, wherein the energy gap reaches a minimum of 1.38 eV for a selenium content between 25% and 40%. For lower selenium content and higher selenium content, the energy gap is higher, wherein the energy gap for a selenium content of 0 (zero) is around 1.5 eV and the energy gap for a selenium content of 100% is around 1.74 eV.

It has to be noted, that the amount w of selenium is given in relation to the ratio with tellurium in a respective $CdSe_wTe_{1-w}$ layer and not as an absolute amount within the $CdSe_wTe_{1-w}$ layer. Thus, other elements, for instance dopants, may be included in the $CdSe_wTe_{1-w}$ layer without changing the relation of selenium to tellurium.

By forming the CdSeTe thin film as comprising three different $CdSe_wTe_{1-w}$ layers by the method according to the invention, the best energy gap for effective photovoltaic conversion of sunlight is provided in the second $CdSe_wTe_{1-w}$ layer. The higher energy gaps at the first and the second side of the CdSeTe thin film have two positive effects: first, the difference in energy bands between the n and p materials of the p-n junction, i.e. the window layer and the CdSeTe thin film of a solar cell, is increased at a front side of the CdSeTe thin film, and second, a mirror effect with respect to minority charge-carriers is caused at the interface of the CdSeTe thin film to the back electrode at a back side of the CdSeTe thin film. Both effects improve the efficiency of a solar cell comprising the double-graded CdSeTe thin film formed by the method according to the invention. The inventive method provides the possibility to tailor the energy gap along the whole thickness of the CdSeTe thin film layer as required to maximize the efficiency of the photovoltaic device comprising the CdSeTe thin film.

Forming the three different $CdSe_wTe_{1-w}$ layers may comprise different process steps, wherein some of the process steps belonging to the formation of one of the first, the second or the third $CdSe_wTe_{1-w}$ layer may be performed in different sequences to each other or even simultaneously. For instance, some temperature treatment steps belonging to formation of different ones of the $CdSe_wTe_{1-w}$ layers may be performed in one step. Temperature treatment steps are process steps during which the substrate is hold at elevated temperatures higher than room temperature (which is in the range between 15° C. and 60° C.). That is, temperature treatment steps may be deposition processes, during which a layer is deposited, or annealing processes, which are performed under a specific atmosphere not resulting in deposition of a layer.

According to some embodiments, at least the second $CdSe_wTe_{1-w}$ layer is formed using co-deposition of cadmium, selenium and tellurium and annealing the deposited layer under an atmosphere containing gaseous selenium. That is, the respective $CdSe_wTe_{1-w}$ layer is formed in one step essentially with the stoichiometry needed in the end. In order to preserve or finally adjust the stoichiometry, the respective $CdSe_wTe_{1-w}$ layer is annealed directly after deposition under a selenium atmosphere controlling the diffusion of selenium out of the deposited $CdSe_wTe_{1-w}$ layer. The amount of selenium incorporated into the formed $CdSe_wTe_{1-w}$ layer can be tuned in terms of substrate temperature, annealing time and selenium content of the annealing atmosphere. These embodiments give the opportunity to obtain a zinc-blende phase of the deposited $CdSe_wTe_{1-w}$ layer even for a selenium content higher than 30%.

In some cases, all $CdSe_wTe_{1-w}$ layers are formed using co-deposition of cadmium, selenium and tellurium and annealing under a selenium containing atmosphere. In these cases, the amounts of cadmium, selenium and tellurium during co-deposition vary at least between the second $CdSe_wTe_{1-w}$ layer and the first and third $CdSe_wTe_{1-w}$ layers. Further, the first $CdSe_wTe_{1-w}$ layer is formed using annealing the deposited layer at a first temperature and under a first atmosphere containing a first amount c1 of gaseous selenium in it for a first time period, the second $CdSe_wTe_{1-w}$ layer is formed using annealing the deposited layer at a second temperature and under a second atmosphere containing a second amount c2 of gaseous selenium in it for a second time period, and the third $CdSe_wTe_{1-w}$ layer is formed using annealing the deposited layer at a third temperature and under a third atmosphere containing a third amount c3 of gaseous selenium in it for a third time period. The first amount w1 and the third amount w3 are larger than zero and smaller than 1. All amounts c1 to c3 of gaseous selenium in the annealing atmospheres are higher than zero, but may vary, as the temperatures and time periods of the different annealing steps can.

In some of these cases, the first amount w1, i.e. the selenium content in the first $CdSe_wTe_{1-w}$ layer, and the third amount w3, i.e. the selenium content in the third $CdSe_wTe_{1-w}$ layer, are higher than the second amount w2, i.e. the selenium content in the second $CdSe_wTe_{1-w}$ layer. In these cases, the first amount c1 and the third amount c3 of gaseous selenium in the annealing atmospheres of the respective process steps are higher than the second amount c2 of gaseous selenium in the annealing atmosphere of the process step for forming the second $CdSe_wTe_{1-w}$ layer.

In a special case, the first amount w1 and the third amount w3 lie in the range between 0.5 and 0.9. The corresponding amounts c1 and c3 of gaseous selenium in the annealing atmospheres can be tuned by means of Se-partial pressure and annealing exposure time and in relation to the c2 amount.

According to other embodiments, at least the first or the third $CdSe_wTe_{1-w}$ layer is formed using deposition of a layer of CdSe and/or a layer of CdTe and annealing the deposited layers. Here, the annealing may be performed later, i.e. not directly after depositing the CdSe layer and/or the CdTe layer. If, for instance, the first $CdSe_wTe_{1-w}$ layer is formed in this way, the annealing may be performed only after depositing a $CdSe_wTe_{1-w}$ layer during the step of forming the second $CdSe_wTe_{1-w}$ layer. In each case, this way of forming one of the first, the second or the third $CdSe_wTe_{1-w}$ layer comprises intermixing between cadmium, selenium and tellurium between solid layers resulting from diffusion of these materials, in particular from diffusion of selenium.

In some cases, a single layer of CdSe or a single layer of CdTe is deposited which is transformed into the first, the second or the third $CdSe_wTe_{1-w}$ layer by diffusion of atoms into or out of the adjacent one of the first, the second and the third $CdSe_wTe_{1-w}$ layer during subsequent annealing. The amount w of selenium within the resulting $CdSe_wTe_{1-w}$ layer can be controlled by the ratio of the thicknesses of the CdSe layer or the CdTe layer, respectively, and the adjacent $CdSe_wTe_{1-w}$ layer as well as by the amount w of selenium within the adjacent $CdSe_wTe_{1-w}$ layer and the temperature and time period of one or more subsequent annealing steps. In a specific case, the first and the third $CdSe_wTe_{1-w}$ layers are formed by depositing a single CdSe layer or a single CdTe layer and diffusion of selenium into or from the second $CdSe_wTe_{1-w}$ layer.

In other cases, a CdSe layer and a CdTe layer are deposited directly above one another and are subsequently annealed resulting in intermixing and forming of a $CdSe_wTe_{1-w}$ layer. The thermal budget of the annealing step, i.e. the temperature and time period of annealing, is preferably controlled such that a complete intermixing of the CdSe layer and the CdTe layer is obtained. The amount w of selenium within the resulting $CdSe_wTe_{1-w}$ layer can be controlled by the ratio of the thicknesses of the CdSe layer and the CdTe layer.

In some cases, all of the first, the second and the third $CdSe_wTe_{1-w}$ layers are formed by such process steps, each one comprising consecutive deposition of a CdSe layer and a CdTe layer and subsequent annealing. That is, the first $CdSe_wTe_{1-w}$ layer is formed using consecutive deposition of a first layer of CdSe with a first thickness d11 and a second layer of CdTe with a second thickness d12 and annealing the deposited layers at a first temperature and under a first atmosphere for a first time period, the second $CdSe_wTe_{1-w}$ layer is formed using consecutive deposition of a second layer of CdSe with a third thickness d21 and a second layer of CdTe with a fourth thickness d22 and annealing the deposited layers at a second temperature and under a second atmosphere for a second time period, and the third $CdSe_wTe_{1-w}$ layer is formed using consecutive deposition of a third layer of CdSe with a fifth thickness d31 and a third layer of CdTe with a sixth thickness d32 and annealing the deposited layers at a third temperature and under a third atmosphere for a third time period. The ratio of the respective thickness of the CdSe layer and the respective thickness of the CdTe layer is different for each of the first, the second and the third $CdSe_wTe_{1-w}$ layer. Furthermore, also the temperatures, the atmospheres and/or the time periods of the respective annealing steps may vary for each of the first, the second and the third $CdSe_wTe_{1-w}$ layer.

In some embodiments, the substrate temperature during deposition of the individual layers and/or annealing lies in the range between 300° C. and 700° C. In some cases, the substrate temperature during deposition of the individual layers lies in the range between 400° C. and 700° C., wherein smaller temperatures result in smaller grains of the deposited layer and in slower deposition. In some of the embodiments, the substrate temperature lies in the range between 300° C. and 500° C. during annealing.

In some of the embodiments comprising deposition of a CdSe layer and/or a CdTe layer, the deposited layers are annealed under an inert or in a reactive atmosphere, where in some cases the atmosphere comprises selenium or chlorine. Annealings in presence of selenium are useful to adjust the selenium concentration in the annealed layers, whereas chlorine annealings are useful to modify the crystal structure of the annealed layers. If, at a certain stage of the process and for a specific stack of layers, the materials need only to intermix each other, annealing can also be performed without additional Se or Cl. This annealing can be performed in an inert atmosphere, for example in Ar, He, $N_2$ or other gases which don't chemically interact with the annealed materials. However, the annealing of the layer stack can even be performed in air, for example for passivating the grain boundaries, or again to intermix CdTe with CdSe phases.

In some embodiments of the invention, at least one of the first, the second or the third $CdSe_wTe_{1-w}$ layer is formed by a process comprising a co-deposition of cadmium, selenium and tellurium, a consecutive deposition of a single layer of CdSe layer or a single CdTe layer and a consecutive annealing step. Thus, the amount of selenium within the resulting $CdSe_wTe_{1-w}$ layer is determined by the relation between selenium and tellurium during co-deposition, the thicknesses of the layer deposited during co-deposition and of the CdSe layer or the CdTe layer and by the conditions of the annealing step, i.e. temperature, annealing atmosphere and time period.

According to some embodiments, the formed double graded CdSeTe thin film structure is the photoactive layer of a solar cell.

If the solar cell is formed in a superstrate configuration, the base substrate comprises a front contact layer and a window layer, wherein the window layer forms a surface of the base substrate, the first $CdSe_wTe_{1-w}$ layer is formed on the window layer, and the method further comprises forming a back contact layer on the third $CdSe_wTe_{1-w}$ layer. In some cases, the third amount w3, i.e. the selenium content in the third $CdSe_wTe_{1-w}$ layer, is larger than the first amount w1, i.e. the selenium content in the first $CdSe_wTe_{1-w}$ layer, and larger than the second amount w2, i.e. the selenium content in the second $CdSe_wTe_{1-w}$ layer. However, other relations of the selenium contents in the different layers are possible as long it is guaranteed that the energy gap in one portion of the first $CdSe_wTe_{1-w}$ layer is higher than that in the second $CdSe_wTe_{1-w}$ layer and the energy gap in one portion of the third $CdSe_wTe_{1-w}$ layer is higher than that in the first $CdSe_wTe_{1-w}$ layer. Preferably, the first thickness d1 of the first $CdSe_wTe_{1-w}$ layer is smaller than the third thickness d3 of the third $CdSe_wTe_{1-w}$ layer, and the third thickness d3 is smaller than the second thickness d2 of the second $CdSe_wTe_{1-w}$ layer. By way of example, the first $CdSe_wTe_{1-w}$ layer may have a thickness smaller than 100 nm, the second $CdSe_wTe_{1-w}$ layer may have a thickness in the range of 1 μm to 2 μm and the third $CdSe_wTe_{1-w}$ layer may be thick enough not to make the whole absorber material exceed 2.5 μm to 3 μm in total.

If the solar cell is formed in a substrate configuration, the base substrate comprises a back contact layer forming a surface of the base substrate, the first $CdSe_wTe_{1-w}$ layer is formed on the back contact layer, and the method further comprises forming a layer stack comprising a window layer and a front contact layer on the third $CdSe_wTe_{1-w}$ layer, wherein the window layer is formed adjacent to the third $CdSe_wTe_{1-w}$ layer. In this case, the first amount w1, i.e. the selenium content in the first $CdSe_wTe_{1-w}$ layer, is larger than the third amount w3, i.e. the selenium content in the third $CdSe_wTe_{1-w}$ layer, and larger than the second amount w2, i.e. the selenium content in the second $CdSe_wTe_{1-w}$ layer. However, other relations of the selenium contents in the different layers are possible as long it is guaranteed that the energy gap in one portion of the third $CdSe_wTe_{1-w}$ layer is higher than that in the second $CdSe_wTe_{1-w}$ layer and the energy gap in one portion of the first $CdSe_wTe_{1-w}$ layer is higher than that in the third $CdSe_wTe_{1-w}$ layer. Preferably, the first thickness d1 of the first $CdSe_wTe_{1-w}$ layer is larger than the third thickness d3 of the third $CdSe_wTe_{1-w}$ layer, and the first thickness d1 is smaller than the second thickness d2 of the second $CdSe_wTe_{1-w}$ layer. By way of example, the third $CdSe_wTe_{1-w}$ layer may have a thickness smaller than 100 nm, the second $CdSe_wTe_{1-w}$ layer may have a thickness in the range of 1 μm to 2 μm and the first $CdSe_wTe_{1-w}$ layer may be thick enough not to make the whole absorber material exceed 2.5 μm to 3 μm in total.

The process steps of providing or forming the other layers of a solar cell, in particular forming a front contact layer, a window layer or a back contact layer, may be performed according to methods well-known from prior art and are therefore not described in detail herein.

In some embodiments of the inventive method, at least one of the first, second and third $CdSe_wTe_{1-w}$ layers or of the starting layers thereof is deposited by sputtering, evaporation or sublimation. These deposition methods provide excellent control of the amount of selenium incorporated within the deposited layer and of the phase and thickness of the deposited layer.

If one of the $CdSe_wTe_{1-w}$ layers is formed by intermixing between solid layers, the formation of a wurtzite phase instead of a zinc-blende phase is probably for selenium atomic concentrations higher than 30%. However, this effect may also occur during formation of a $CdSe_wTe_{1-w}$ layer using co-deposition of cadmium, selenium and tellurium. In order to prevent the formation of a wurtzite phase, in some embodiments, a dopant is inserted into at least that one of the first, the second or the third $CdSe_wTe_{1-w}$ layer having an amount of selenium higher than 0.3. Moreover, the energy gap of the respective $CdSe_wTe_{1-w}$ layer may be finely tuned in relation to the amount of both selenium and the dopant. The dopant is preferably selected from, but not limited to, the group of Zn, Mg and Mn and combinations thereof. The dopant may be inserted using co-deposition of the dopant for at least a part of the time of co-deposition of cadmium, selenium and tellurium during forming the respective $CdSe_wTe_{1-w}$ layer using co-deposition of cadmium, selenium and tellurium or may be inserted using forming one or more layers of a composition of tellurium with the dopant within or adjacent to the layer stack comprising the first, the second and the third $CdSe_wTe_{1-w}$ layers. In the last case, the layer of a composition of tellurium with the dopant is preferably formed adjacent to the $CdSe_wTe_{1-w}$ layer having an amount of selenium higher than 0.3. Furthermore, a temperature treatment step is preferably performed after forming one or more layers of a composition of tellurium with the dopant for introducing the dopant into an adjacent $CdSe_wTe_{1-w}$ layer by diffusion. In the result, the dopant has an amount in the range between 0.001 and 0.2 within the $CdSe_wTe_{1-w}$ layer having an amount of selenium higher than 0.3. Preferred concentrations for the dopant can be considered within a range between 0.001 and 0.01.

In some embodiments of the inventive method, a barrier layer is formed at least between the first and the second $CdSe_wTe_{1-w}$ layers or between the second and the third $CdSe_wTe_{1-w}$ layers. The barrier layer reduces the diffusion of selenium between the $CdSe_wTe_{1-w}$ layers adjacent to the barrier layer. Especially with respect to the second $CdSe_wTe_{1-w}$ layer, it is preferably to keep the amount of selenium fixed within the $CdSe_wTe_{1-w}$ layers in order to obtain the desired energy gaps along the thickness of the CdSeTe thin film structure. In some embodiments, the barrier layer is a thin film comprising one of ZnO, MnO or MgO or combinations thereof and has a thickness in the range from 1 nm to 50 nm, in particular from 1 nm to 5 nm.

Another option for stabilizing the amount of selenium within a specific one of the first, the second or the third $CdSe_wTe_{1-w}$ layer, is to perform a chlorine-based treatment consecutive to forming the specific $CdSe_wTe_{1-w}$ layer. This treatment may be an annealing under a chlorine containing gaseous atmosphere or by a former chemical treatment with Cl-based chemicals, like for example, but not limited to, $CdCl_2$, $MgCl_2$, $ZnCl_2$, $CuCl_2$ or combinations thereof and a further annealing step. In some embodiments, the selenium stabilization process can also be obtained by depositing one of the first, the second or the third $CdSe_wTe_{1-w}$ layer, or a doped $CdSe_wTe_{1-w}$ layer, or a barrier layer as described above in a chlorine-containing deposition atmosphere. It promotes a recrystallization of the specific $CdSe_wTe_{1-w}$ layer, making it more compact with less grain boundaries and limiting the selenium migration, which mostly takes place along grain boundaries.

Several combinations of the embodiments of the inventive method are possible, as long as they do not preclude each other.

In the following detailed description reference is made to the accompanying drawings, which form a part hereof and in which specific embodiments are illustrated, in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims. The elements of the drawings are not necessarily to scale relative to each other. Like reference numbers designate corresponding similar parts.

DESCRIPTION OF THE SPECIFIC EMBODIMENTS

Figure 1:
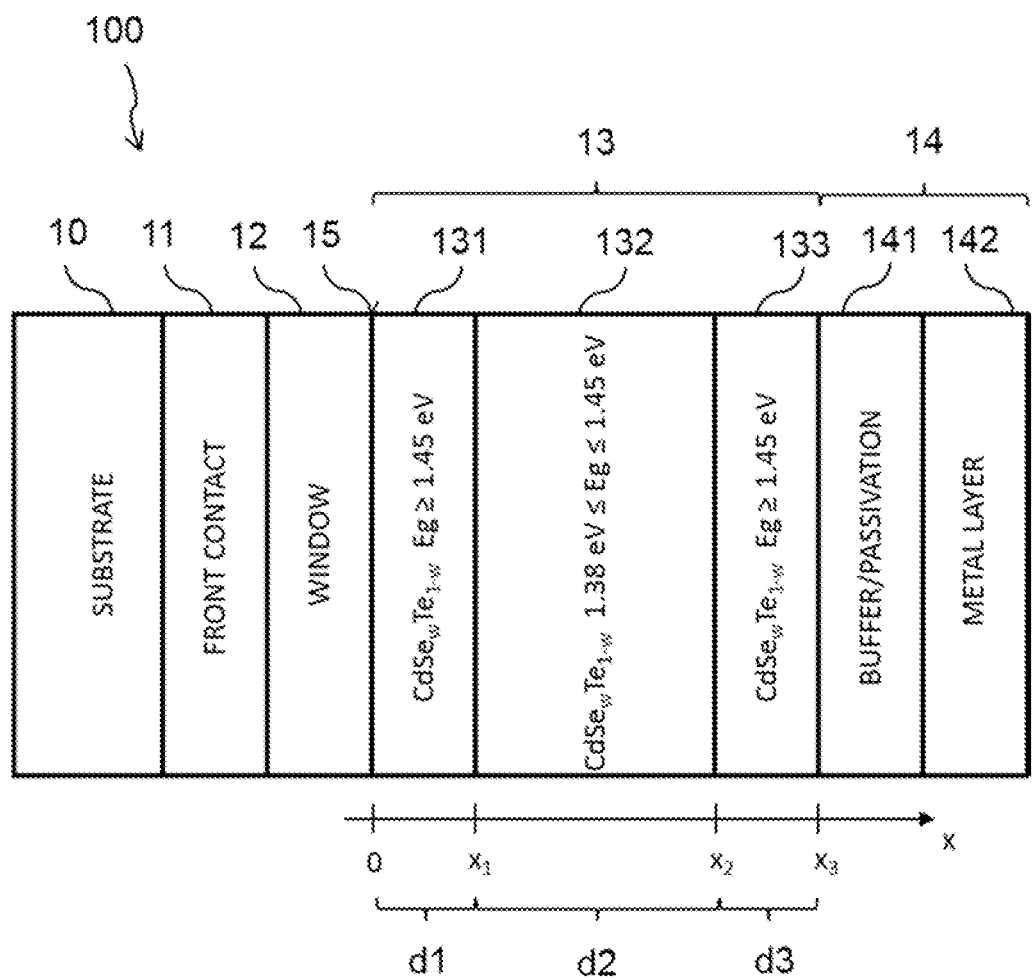
FIG. 1 schematically shows the layer structure of a solar cell produced by an embodiment of the method according to the invention, wherein the solar cell is formed in a superstrate configuration.

FIG. 1 schematically shows a solar cell 100 formed in a superstrate configuration by an embodiment of the method according to the invention. The layer structure of the solar cell 100 is shown, wherein the solar cell 100 comprises a substrate 10, a front contact layer 11, a window layer 12, a photoactive layer 13 and a back contact layer 14. The substrate 10 may be a transparent substrate, e.g. made of glass or transparent polymer. The front contact layer 11 may be a transparent conductive oxide, e.g. indium tin oxide (ITO) or aluminum doped zinc oxide (AZO), fluorine doped-tin oxide, or a layer stack of such a layer and a buffer layer, e.g. of cadmium stannate, intrinsic tin oxide, or intrinsic zinc oxide. The window layer 12 is a layer of cadmium sulfide (CdS) having an n-conductivity. However, the solar cell may also be formed without the window layer 12 or with a window layer formed of other materials. The photoactive layer 13 is a CdSeTe thin film comprising three different $CdSe_wTe_{1-w}$ layers: a first $CdSe_wTe_{1-w}$ layer 131 having a first thickness d1 and a first amount w1 of selenium in it, a second $CdSe_wTe_{1-w}$ layer 132 having a second thickness d2 and a second amount w2 of selenium in it and a third $CdSe_wTe_{1-w}$ layer 133 having a third thickness d3 and a third amount w3 of selenium in it. The back contact layer 14 is also a layer stack comprising a buffer layer 141 of, but not limited to, Te, MgTe, ZnTe, CdZnTe, $As_2Te_3$, $Sb_2Te_3$, $Bi_2Te_3$, $Cu_xTe_{1-x}$, $MoO_y$, MoN, and a metal layer 142, e.g. made of, but not limited to, Mo, W, Ta, Hf, Al, Cr, Ni, Ti, Au, Ag as well as multi-layer combinations.

Figure 3:
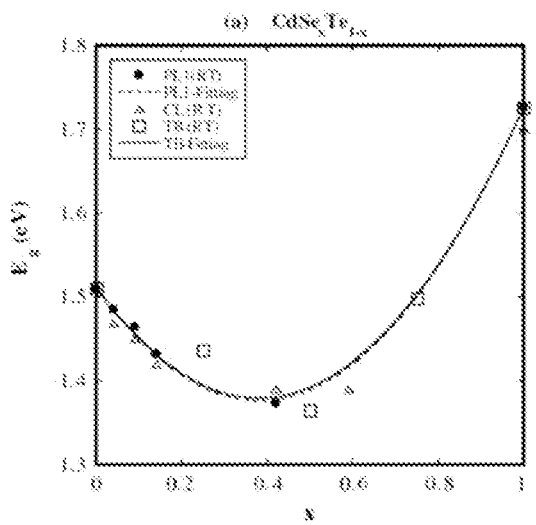
FIG. 3 schematically shows the dependence of the energy gap $E_g$ of a $CdSe_wTe_{1-w}$ layer on the amount w of selenium.

The photoactive layer 13 has a p-conductivity. Therefore, a p-n junction 15 is formed between the window layer 12 and the photoactive layer 13. The energy gap $E_g$ varies over the thickness of the photoactive layer 13, wherein the first $CdSe_wTe_{1-w}$ layer 131 has a first energy gap $E_{g1}$ equal to or larger than 1.45 eV, the second $CdSe_wTe_{1-w}$ layer 132 has a second energy gap $E_{g2}$ lying in the range between 1.38 eV and 1.45 eV, and the third $CdSe_wTe_{1-w}$ layer 133 has a third energy gap $E_{g3}$ equal to or larger than 1.45 eV. The energy gap $E_g$ strongly depends on the amount w of selenium within the respective $CdSe_wTe_{1-w}$ layer, as schematically shown in FIG. 3. The figure shows different measured energy gap values and two fitting curves. The measured values referenced as PL1 (RT) are measured by photoluminescence spectroscopy for $CdSe_wTe_{1-w}$ layers which are deposited on Si substrates by molecular beam epitaxy (MBE) technique, the measured values referenced as CL (RT) are measured by chatodoluminescence for the same $CdSe_wTe_{1-w}$ layers, and the simulated values referenced as TB (RT) are calculated by means of the tight-binding method for similar $CdSe_wTe_{1-w}$ layers. The fitting curves refer to the respective measured values as their respective reference name indicates. [Reference: J. Phys.: Condens. Matter 21 (2009) 075802].

Figure 2:
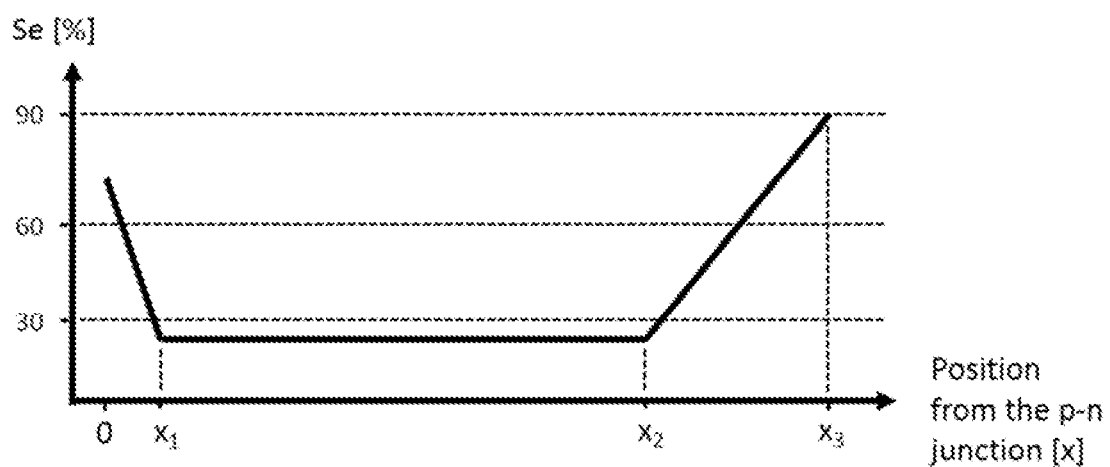
FIG. 2 schematically shows an exemplary distribution of the selenium content within the photoactive layer.

FIG. 2 schematically shows an exemplary distribution of the selenium content w within the photoactive layer, i.e. the CdSeTe thin film, over the thickness of the CdSeTe thin film, the thickness extending along the x-axis. Where x=0, the p-n junction 15 between the window layer 12 and the photoactive layer 13 from FIG. 1 lies. The first $CdSe_wTe_{1-w}$ layer 131 extends from x=0 to $x=x_1$, the second CdSeTe layer 132 extends from $x=x_1$ to $x=x_2$, and the third $CdSe_wTe_{1-w}$ layer 133 extends from $x=x_2$ to $x=x_3$. Within the first $CdSe_wTe_{1-w}$ layer 131, the amount of selenium lies over 25% and falls from a maximum lying in the range between 60% and 90% at the p-n junction to a minimum of 25% at the interface to the second $CdSe_wTe_{1-w}$ layer 132. Within the second $CdSe_wTe_{1-w}$ layer 132, the amount of selenium is about 25% and essentially constant resulting in a thick layer being most effective in photoelectric conversion of sunlight. Within the third $CdSe_wTe_{1-w}$ layer 133, the amount of selenium again raises from a minimum of 25% at the interface to the second $CdSe_wTe_{1-w}$ layer 132 to a maximum of 90% at the interface to the back contact layer 14. The first $CdSe_wTe_{1-w}$ layer 131 has a smaller thickness d1 than the thicknesses d2 and d3, and the second $CdSe_wTe_{1-w}$ layer 132 has the largest thickness of all three $CdSe_wTe_{1-w}$ layers 131 to 133. Although linear courses of the selenium amount are shown for the first and the third $CdSe_wTe_{1-w}$ layers 131 and 133, there might also be other, nonlinear or even discontinuous courses. Furthermore, the selenium amount within the first and the third $CdSe_wTe_{1-w}$ layers 131 and 133 may also be constant over the whole thickness of the first or the third $CdSe_wTe_{1-w}$ layer 131 or 133, respectively, or may vary over the respective thickness, but without reaching the amount of selenium within the second $CdSe_wTe_{1-w}$ layer 132. The last possibilities can be reached by a barrier layer formed between the first $CdSe_wTe_{1-w}$ layer 131 and the second $CdSe_wTe_{1-w}$ layer 132 or the second $CdSe_wTe_{1-w}$ layer 132 and the third $CdSe_wTe_{1-w}$ layer 133, respectively, wherein the barrier layer prevents the migration of selenium from the first or the third $CdSe_wTe_{1-w}$ layers 131 or 133 into the second $CdSe_wTe_{1-w}$ layer 132.

Moreover, the mentioned energy gaps in the first and the third $CdSe_wTe_{1-w}$ layers 131 and 133 may also be obtained by amounts of selenium smaller than 10%, as can be seen from FIG. 3.

Figure 4:
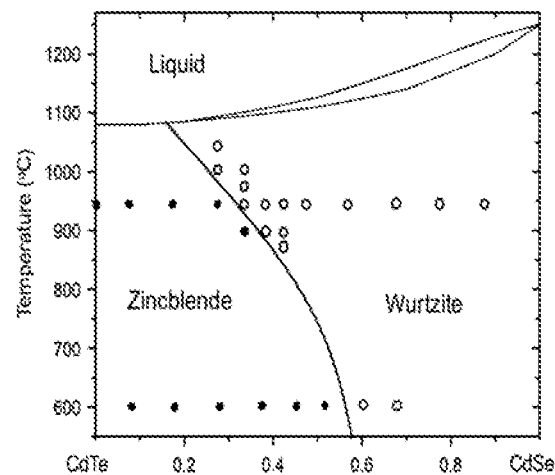
FIG. 4 schematically shows the different phases of a $CdSe_wTe_{1-w}$ layer in dependence on the amount of selenium within the $CdSe_wTe_{1-w}$ layer and on the temperature of the $CdSe_wTe_{1-w}$ layer.

FIG. 4 schematically shows the relation between the amount of selenium within a $CdSe_wTe_{1-w}$ layer, a temperature a $CdSe_wTe_{1-w}$ layer is exposed to during formation and the phase of the $CdSe_wTe_{1-w}$ layer. As can be seen, for amounts of selenium smaller than 60% and temperatures smaller than 600° C., the zinc-blende phase is obtained, whereas for higher amounts of selenium or even for smaller amounts of selenium, but higher temperatures, the wurtzite phase is obtained. Therefore, high amounts of selenium and/or high temperatures during formation of the $CdSe_wTe_{1-w}$ layer are critical for obtaining photoactive layers having high efficiency and good electrical properties. [Reference: J. D. Poplawsky et al., Nature Communications, July 2016].

Figure 5:
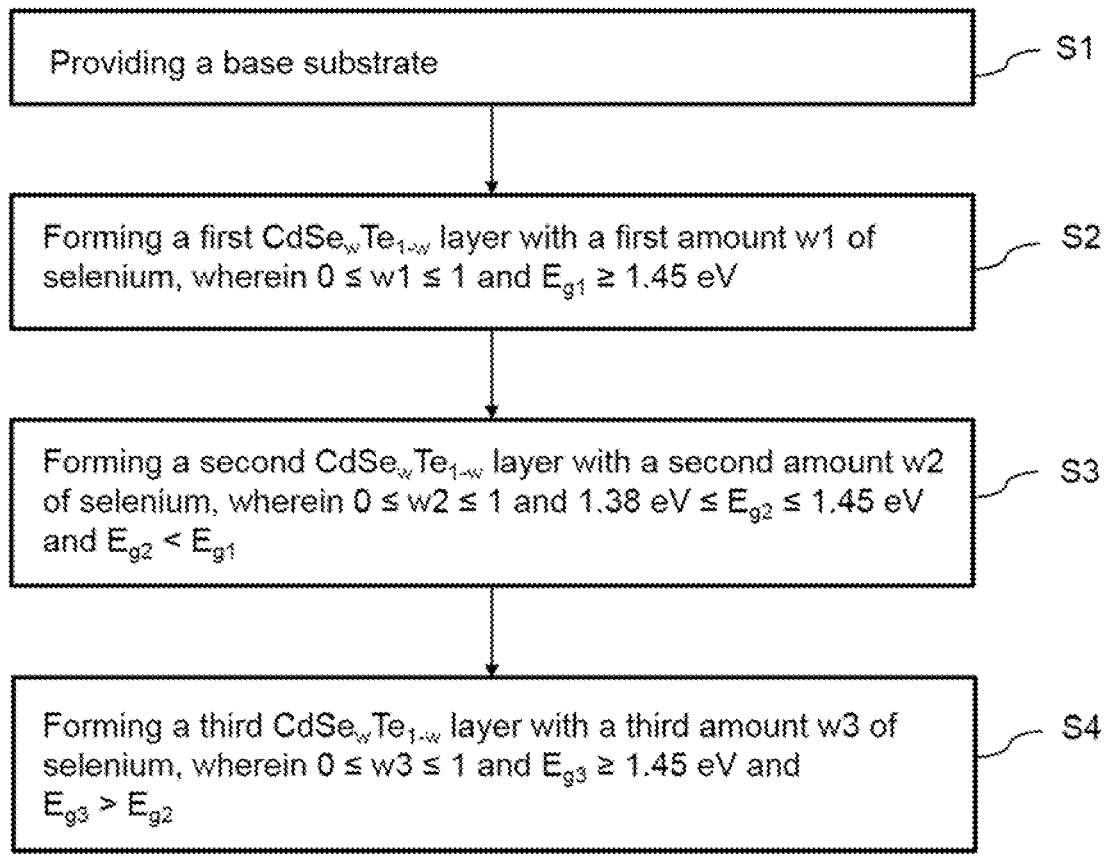
FIG. 5 schematically shows the method for forming a double-graded CdSeTe thin film according to the invention.

FIG. 5 schematically shows the process steps of the method for forming a double-graded CdSeTe thin film according to the invention. First, a base substrate is provided (step S1). Then, a first $CdSe_wTe_{1-w}$ layer is formed on the base substrate, wherein the first $CdSe_wTe_{1-w}$ layer has a first amount w1 of selenium in it with 0≤w1≤1 and a first energy gap $E_{g1}$ being larger than or equal to 1.45 eV (step S2). Further, a second $CdSe_wTe_{1-w}$ layer is formed on the first $CdSe_wTe_{1-w}$ layer, wherein the second $CdSe_wTe_{1-w}$ layer has a second amount w2 of selenium in it with 0≤w2≤1 and a second energy gap $E_{g2}$ with 1.38 eV≤$E_{g2}$≤1.45 eV, $E_{g2}$ being smaller than the first energy gap $E_{g1}$ (step S3). Finally, a third $CdSe_wTe_{1-w}$ layer is formed on the second $CdSe_wTe_{1-w}$ layer, wherein the third $CdSe_wTe_{1-w}$ layer has a third amount w3 of selenium in it with 0≤w3≤1 and a third energy gap $E_{g3}$ being larger than or equal to 1.45 eV and larger than the second energy gap $E_{g2}$ (step S4). Each of the steps S1 to S4 may comprise a plurality of substeps, wherein some of the substeps of the steps S2 to S4 may be performed subsequent to other substeps of the steps S2 to S4 or may be performed simultaneously with each other. For instance, temperature treatment steps may be performed simultaneously. Therefore the steps S2 and S3 may be completed not until step S4 has been completed.

Figure 6A:
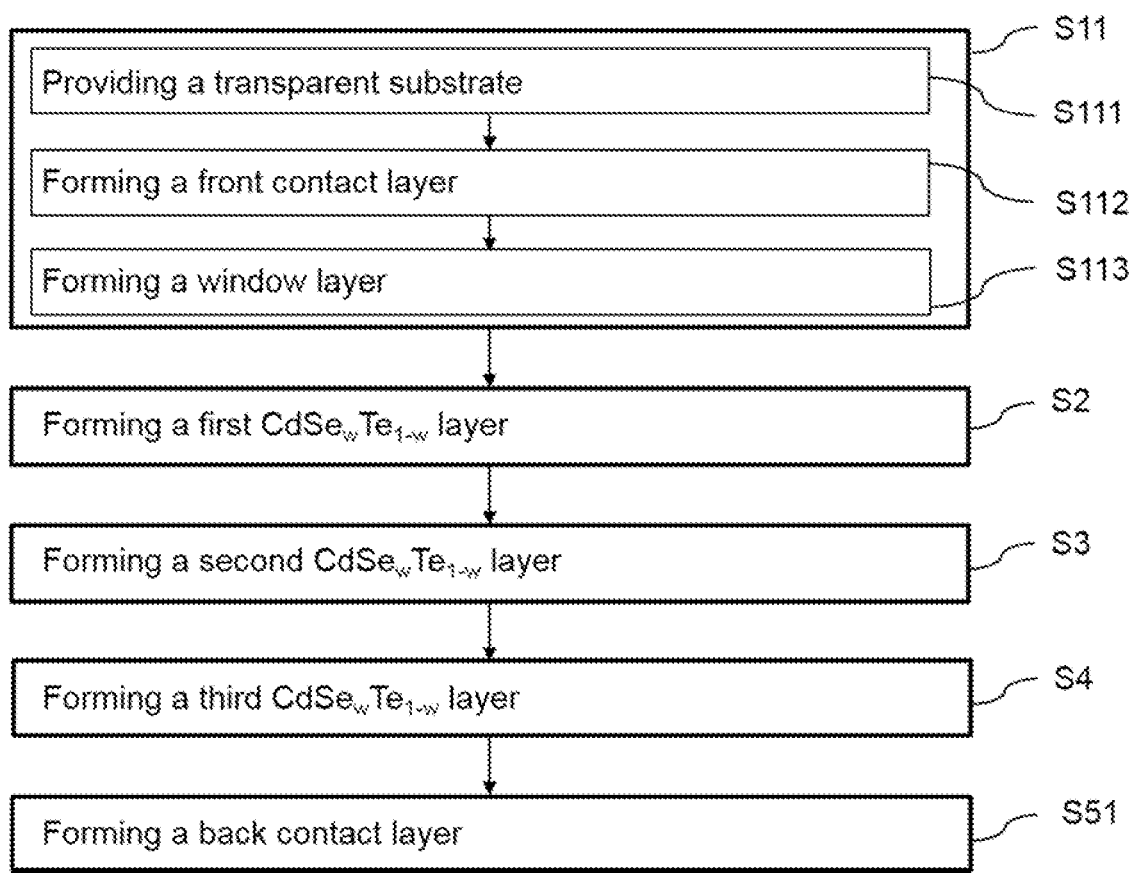
FIGS. 6A and 6B schematically show methods for forming a solar cell comprising the double-graded CdSeTe thin film in a superstrate configuration or a substrate configuration, respectively.
Figure 6B:
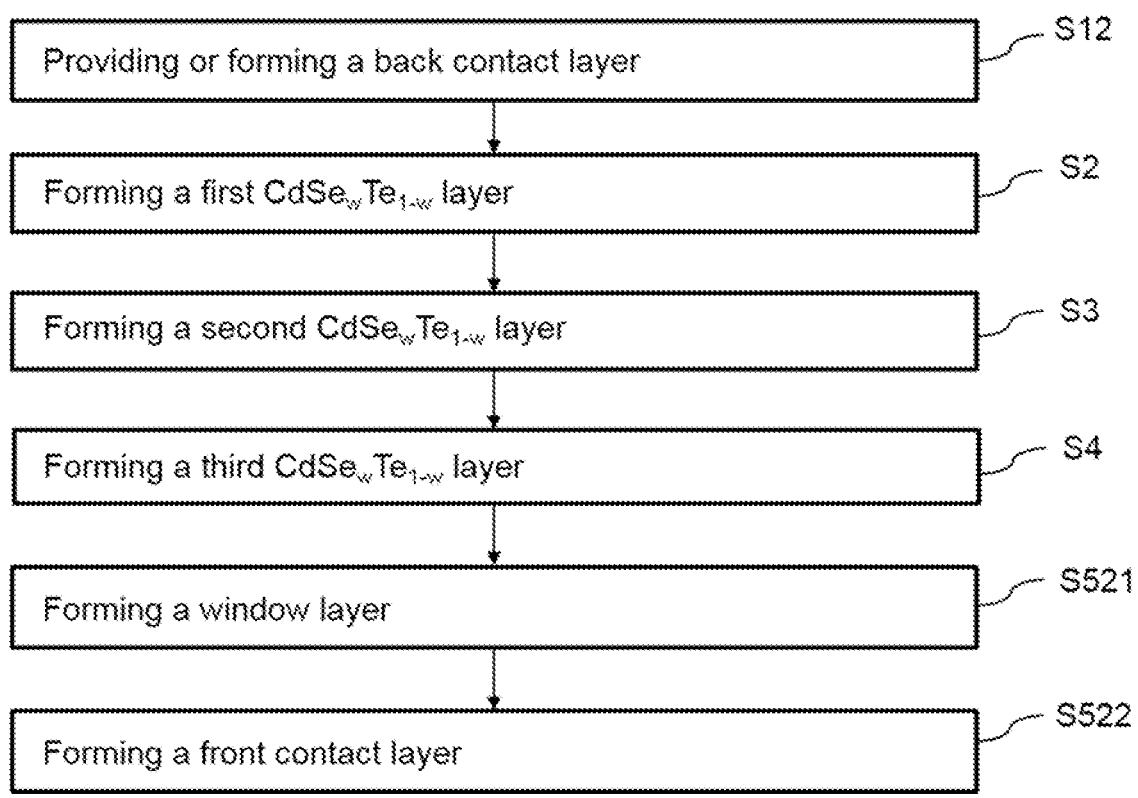

With respect to FIGS. 6A and 6B, a method for forming a solar cell comprising the double-grades CdSeTe thin film is described, wherein FIG. 6A schematically shows a superstrate configuration and FIG. 6B schematically shows a substrate configuration.

In the superstrate configuration of FIG. 6A, a first step S11 being an exemplary embodiment of step S1 of FIG. 5 comprises the substeps of providing a transparent substrate, for instance made of glass, (step S111), forming a front contact layer on the transparent substrate (step S112) and forming a window layer on the front contact layer (step S113). In the result, the base substrate onto which the first $CdSe_wTe_{1-w}$ layer is formed is provided. The front contact layer may comprise a transparent oxide or any other electrode material suitable for the whole process of forming a solar cell and suitable for operating a solar cell. The step S112 may comprises depositing a continuous layer of the front contact material, structuring that layer and forming a transparent material in between the structures of the front contact material. Further, the step S112 may comprises depositing and/or structuring different front contact material layers thereby forming, for instance, thin lines of metal electrodes and a continuous layer of a transparent conductive oxide. The window layer may comprise a CdS layer or any other suitable layer forming a p-n junction with the CdSeTe thin film.

After forming the double-graded CdSeTe thin film by process steps S2 to S4 as described with respect to FIG. 5, a back contact layer is formed on the CdSeTe thin film (step S51). Also a Cl-based treatment step can be included in the process sequence of steps S2 to S4. The back contact layer may comprise a metal layer or different layers of different materials as known from the state of the art. Further, the step S51 may comprise a further substep for activation of the CdSeTe thin film or cleaning the surface of the CdSeTe thin film. By having an adapted $CdSe_wTe_{1-w}$ material at the back contact, the interface to the metal-based back contact can be optimized and this can avoid the use of complicated structure stacks or specific buffer materials in between for ensuring a good ohmic back contact.

In the substrate configuration of FIG. 6B, a first step S12 being another exemplary embodiment of step S1 of FIG. 5 comprises providing or forming a back contact layer. That is, the back contact layer may be provided in form of a metal foil or any other electrical conductive substrate suitable as a back electrode of the solar cell or may be formed on any suitable substrate which may also be an electrical isolating material by, for instance, depositing a back contact layer or a plurality of layers forming a back contact layer. In the result, the base substrate onto which the first $CdSe_wTe_{1-w}$ layer is formed is provided.

After forming the double-graded CdSeTe thin film by process steps S2 to S4 as described with respect to FIG. 5 (but in reverse order with respect to the selenium contents and the resulting energy gaps), a window layer is formed on the CdSeTe thin film (step S521) and a front contact layer is formed on the window layer (step S522). The window layer and the front contact layer may be formed similar to the way described above with respect to FIG. 6A, but in reverse order.

In both embodiments of the method for forming a solar cell, one or all of the front contact layer or the window layer or the back contact layer may comprise a buffer layer or barrier layers or passivation layer or any other layer improving the efficiency of the solar cell.

Figure 7:
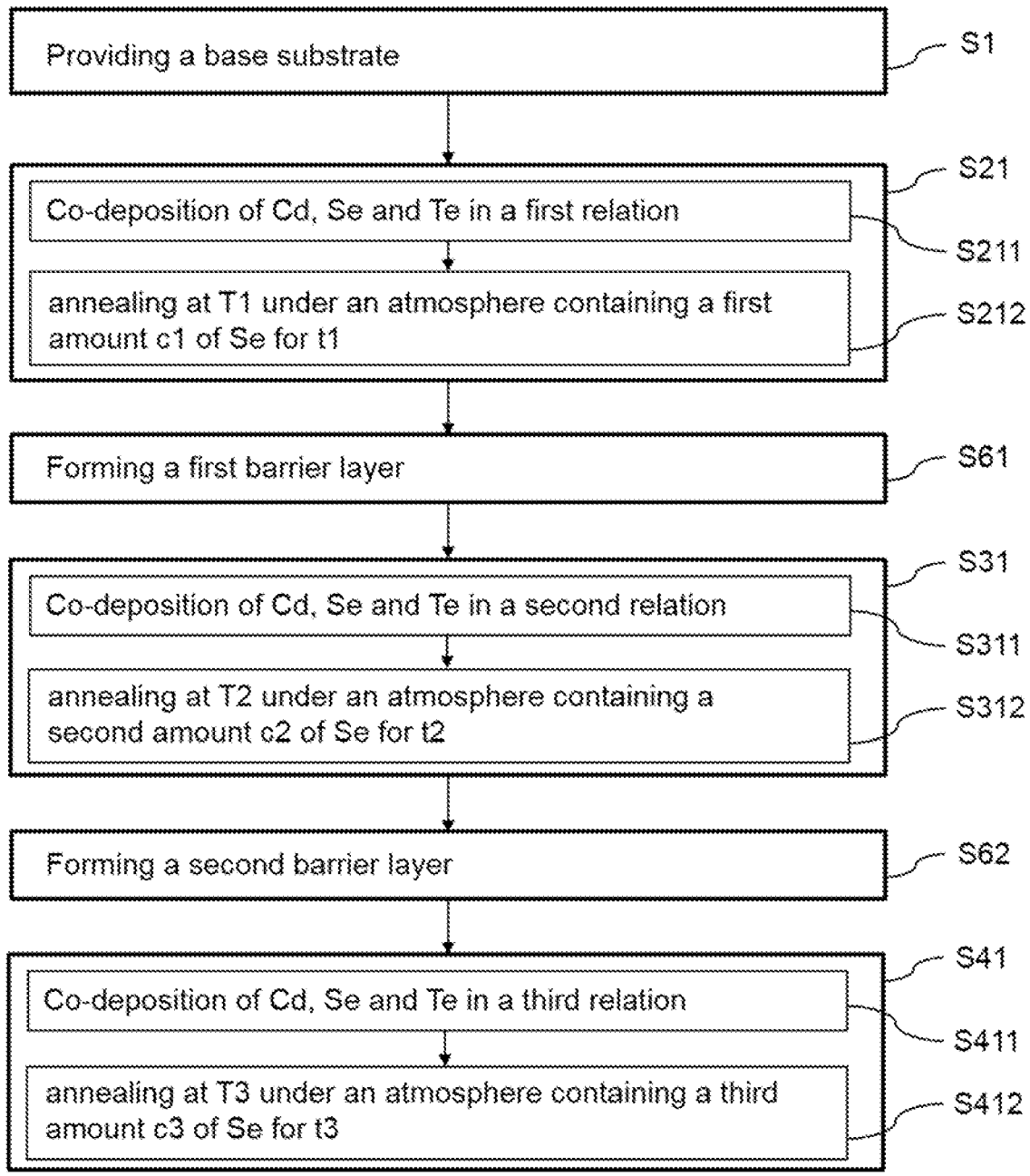
FIG. 7 schematically shows a first embodiment of the inventive method for forming a double-graded CdSeTe thin film, wherein each $CdSe_wTe_{1-w}$ layer is formed using a co-deposition of cadmium, selenium and tellurium and a consecutive annealing under a selenium containing atmosphere.

FIG. 7 schematically shows a first embodiment of the inventive method for forming a double-graded CdSeTe thin film. In this embodiment, each $CdSe_wTe_{1-w}$ layer is formed using a co-deposition of cadmium, selenium and tellurium and a consecutive annealing under a selenium-containing atmosphere.

Step S21 being an embodiment of step S2 of FIG. 5 comprises a first substep S211 of co-depositing cadmium, selenium and tellurium, wherein the elements, in particular selenium and tellurium, have a first relation to each other. For instance, the amount w1 of selenium integrated in the deposited $CdSe_wTe_{1-w}$ layer lies in the range between 0.5 and 0.9. The deposited $CdSe_wTe_{1-w}$ layer has a thickness in the range of 1 nm to 100 nm. Subsequent, in a second substep S212, the deposited $CdSe_wTe_{1-w}$ layer is annealed under an atmosphere containing a first amount c1 of gaseous selenium, wherein c1 is chosen such that out-diffusion of selenium during annealing can be prevented. The annealing is performed under a first temperature T1 for a first time period t1, for instance for 20 min to 30 min.

In step S61, a first barrier layer, made for instance of ZnO with a thickness of 1 nm to 5 nm, is formed on the first $CdSe_wTe_{1-w}$ layer, for instance by sputtering.

After step S61, a second $CdSe_wTe_{1-w}$ layer is formed on the first barrier layer in step S31 comprising a first substep S311 of co-deposition of Cd, Se and Te and a second substep S312. The elements Cd, Se and Te have a second relation to each other in substep S311, such that the amount w2 of selenium integrated in the deposited $CdSe_wTe_{1-w}$ layer lies in the range between 0.25 and 0.4. The deposited $CdSe_wTe_{1-w}$ layer has a thickness in the range of 500 nm to 2000 nm. The atmosphere used in substep S312 contains a second amount c2 of gaseous selenium, wherein c2 is chosen such that out-diffusion of selenium during annealing can be prevented, as described above. The annealing is performed under a second temperature T2 for a second time period t2, for instance for 20 min to 30 min.

Subsequent to step S31, a second barrier layer, made for instance of ZnO with a thickness of 1 nm to 5 nm, is formed on the second $CdSe_wTe_{1-w}$ layer, for instance by sputtering, in step S62.

After step S62, a third $CdSe_wTe_{1-w}$ layer is formed on the second barrier layer in step S41 comprising a first substep S411 of co-deposition of Cd, Se and Te and a second substep S412. The elements Cd, Se and Te have a third relation to each other in substep S411, such that the amount w3 of selenium integrated in the deposited $CdSe_wTe_{1-w}$ layer lies in the range between 0.5 and 0.9. The deposited $CdSe_wTe_{1-w}$ layer has a thickness in the range of 100 nm to 1500 nm. The atmosphere used in substep S412 contains a third amount c3 of gaseous selenium, wherein c3 is chosen such that out-diffusion of selenium during annealing can be prevented, as described above. The annealing is performed under a third temperature T3 for a third time period t3, for instance for 20 min to 30 min.

The co-deposition of Cd, Se and Te may be performed by sputtering, evaporation or sublimation, in particular closed space sublimation (CSS) as known from the state of the art. The substrate, onto which cadmium, selenium and tellurium are deposited, has preferably a substrate temperature in the range between 300° C. and 550° C., for instance 500° C., during co-deposition and/or annealing. The substrate temperature should not exceed 700° C. in any of these substeps for glass substrates. The time periods of the annealing substeps depend on the thickness of the respective deposited $CdSe_wTe_{1-w}$ layer. Due to co-deposition, the desired amount w of the respective $CdSe_wTe_{1-w}$ layer formed in the whole forming step may be controlled and adjusted in a good manner already during the deposition of the respective $CdSe_wTe_{1-w}$ layer. Furthermore, the concentration of gaseous selenium within the annealing atmosphere ensures control of the desired amount w of the respective $CdSe_wTe_{1-w}$ layer. Co-deposition and annealing at temperatures in the given ranges result in forming the zinc-blende phase of the respective $CdSe_wTe_{1-w}$ layer.

The first and the second barrier layer prevent the cross-diffusion of selenium between the second $CdSe_wTe_{1-w}$ layer on one side and the first or the third $CdSe_wTe_{1-w}$ layer on the other side. However, the barrier layers may also be omitted resulting in smoother transition of the selenium content and the energy gaps between the different $CdSe_wTe_{1-w}$ layers. The barrier layers may be formed by directly depositing the compound material specified, or by co-deposition of the contained elements using sputtering, evaporation or sublimation or by chemical vapour deposition or may be formed by deposition of an elemental dopant layer, for instance a zinc layer, and a subsequent oxidation.

Additionally, a dopant, for instance Zn, may be inserted into the first and/or the third $CdSe_wTe_{1-w}$ layer by co-deposition during the respective substeps of co-deposition of Cd, Se and Te. The dopant may be inserted into the deposited $CdSe_wTe_{1-w}$ layer with an amount in the range from 0.001 to 0.2, for instance with an amount of 0.01.

Figure 8:
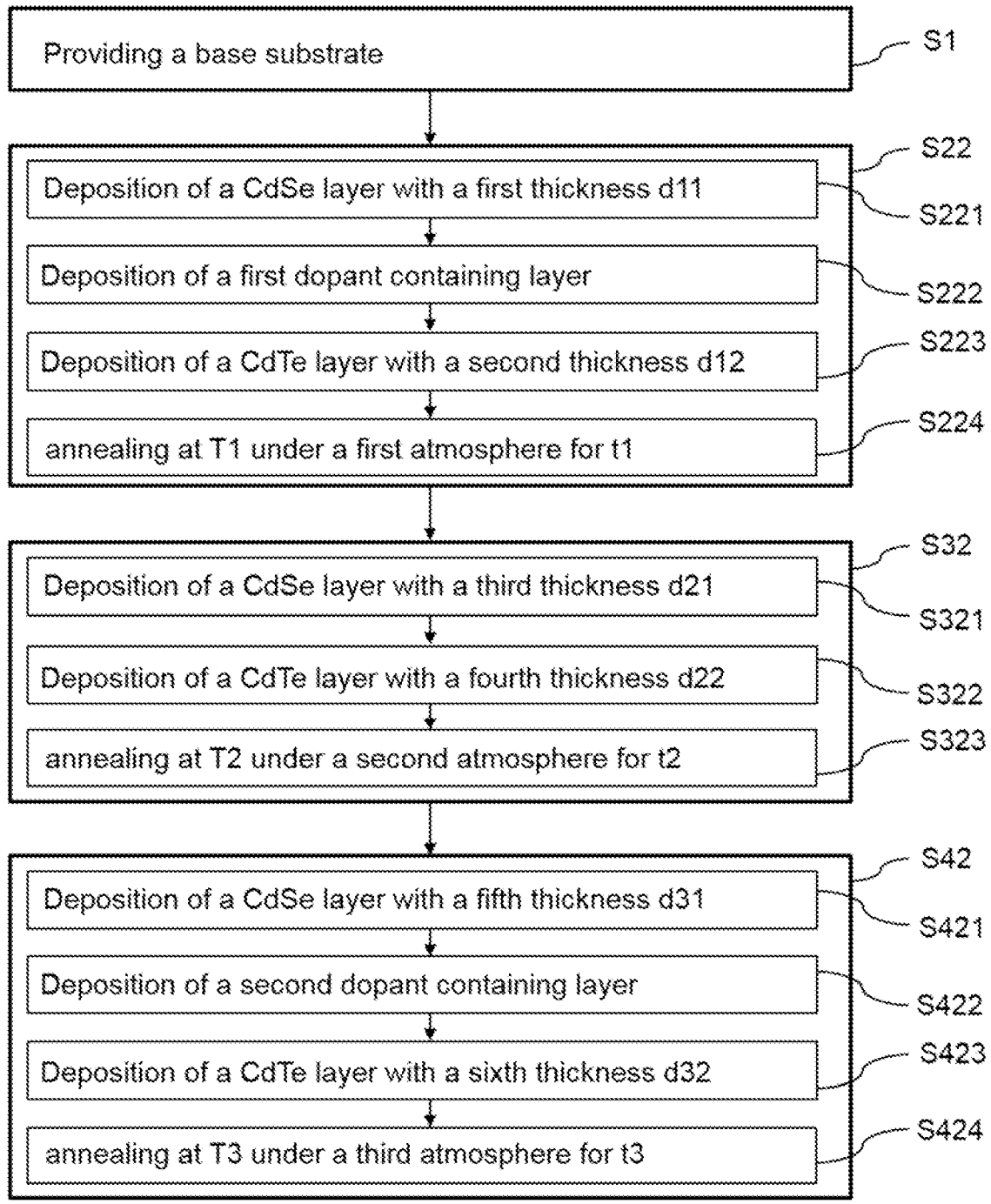
FIG. 8 schematically shows a second embodiment of the inventive method for forming a double-graded CdSeTe thin film, wherein each $CdSe_wTe_{1-w}$ layer is formed using consecutive deposition of a CdSe layer and a CdTe layer and an annealing step.

FIG. 8 schematically shows a second embodiment of the inventive method for forming a double-graded CdSeTe thin film. In this embodiment, each $CdSe_wTe_{1-w}$ layer is formed using consecutive deposition of a CdSe layer and a CdTe layer and a consecutive annealing step.

Step S22 being an embodiment of step S2 of FIG. 5 comprises a first substep S221 of depositing a first CdSe layer having a first thickness d11 onto the base substrate. The first thickness d11 lies in the range of 1 nm to 100 nm. Subsequent, in a second substep S222, a first dopant containing layer, for instance of $Zn_yTe_{1-y}$ with an amount y1 of Zn in the range between 0.001 and 0.1, is deposited on the first CdSe layer with a thickness dm1 in the range between 1 nm to 10 nm, for instance with a thickness dm1 of 2 nm. In a third substep S223, a first CdTe layer having a second thickness d12 is deposited onto the first dopant containing layer. The second thickness d12 lies in the range of 1 nm to 100 nm, wherein the ratio of the first thickness d11 to the second thickness d12 and the thickness dm1 of the first dopant containing layer determines the amount w1 of selenium incorporated in the $CdSe_wTe_{1-w}$ layer resulting from the whole step S22. After substep S223, an annealing step (substep S224) is performed at a first temperature T1 under a first atmosphere for a first time period t1, for instance for 20 min to 30 min. In the result, the first $CdSe_wTe_{1-w}$ layer, which is a doped $CdSe_wTe_{1-w}$ layer, is formed.

The second $CdSe_wTe_{1-w}$ layer is formed by a similar sequence of substeps in step S32, wherein however no dopant containing layer is deposited. That is, in a first substep S321, a second CdSe layer having a third thickness d21 is deposited onto the first $CdSe_wTe_{1-w}$ layer. The third thickness d21 lies in the range of 50 nm to 2000 nm. Subsequent, in a second substep S322, a second CdTe layer having a fourth thickness d22 is deposited onto the second CdSe layer. The fourth thickness d22 lies in the range of 50 nm to 2000 nm, wherein the ratio of the third thickness d21 to the fourth thickness d22 determines the amount w2 of selenium incorporated in the $CdSe_wTe_{1-w}$ layer resulting from the whole step S32. After substep S322, an annealing step (substep S323) is performed at a second temperature T2 under a second atmosphere for a second time period t2, for instance for 20 min to 30 min. In the result, the second $CdSe_wTe_{1-w}$ layer is formed.

In step S42, a third $CdSe_wTe_{1-w}$ layer is formed. Similar to step S22, step S42 comprises a first substep S421 of depositing a third CdSe layer having a fifth thickness d31 onto the second $CdSe_wTe_{1-w}$ layer. The fifth thickness d31 lies in the range of 10 nm to 1500 nm. Subsequent, in a second substep S422, a second dopant containing layer, for instance of $Zn_yTe_{1-y}$ with an amount y2 of Zn in the range between 0.001 and 0.1, is deposited on the third CdSe layer with a thickness dm2 in the range between 1 nm to 10 nm, for instance with a thickness dm2 of 5 nm. In a third substep S423, a third CdTe layer having a sixth thickness d32 is deposited onto the second dopant containing layer. The sixth thickness d32 lies in the range of 10 nm to 1500 nm, wherein the ratio of the fifth thickness d31 to the sixth thickness d32 and the thickness dm2 of the second dopant containing layer determines the amount w3 of selenium incorporated in the $CdSe_wTe_{1-w}$ layer resulting from the whole step S42. After substep S423, an annealing step (substep S424) is performed at a third temperature T3 under a third atmosphere for a third time period t3, for instance for 20 min to 30 min.

Although the consecutive deposition of one CdSe layer and one CdTe layer is described above, the formation of a $CdSe_wTe_{1-w}$ layer may also comprise a plurality of consecutive steps of depositing a layer stack comprising a CdSe layer and a CdTe layer and, if applicable, a dopant containing layer. In particular for forming a thick $CdSe_wTe_{1-w}$ layer, such a multistack process may be advantageous for achieving a constant selenium amount throughout the whole formed $CdSe_wTe_{1-w}$ layer and/or for reducing the annealing time.

The deposition of the respective CdSe layers and CdTe layers and the dopant containing layers may be performed by sputtering, evaporation or sublimation, in particular closed space sublimation (CSS) as known from the state of the art. The substrate, onto which these layers are deposited, has preferably a substrate temperature in the range between 300° C. and 700° C., for instance 500° C., during deposition of the layers. During annealing, the substrate temperature lies in the range between 300° C. and 700° C., for instance 400° C. The temperature should not exceed 700° C. in any of the substeps. The time periods of the annealing substeps depend on the thicknesses of the respective deposited CdSe layer and CdTe layer. The atmosphere during annealing may contain selenium or/and chlorine or any other suitable gases. The concentration of selenium or chlorine, if present, lies in the range between 0.1% and 100%. Due to annealing, the respective CdSe layer and CdTe layer intermixed with each other thereby forming the respective $CdSe_wTe_{1-w}$ layer. Furthermore, the dopant dispersing throughout the resulting $CdSe_wTe_{1-w}$ layer ensures forming the zinc-blende phase of the respective $CdSe_wTe_{1-w}$ layer.

Additionally, a barrier layer may be formed between the second $CdSe_wTe_{1-w}$ layer on one side and the first or the third $CdSe_wTe_{1-w}$ layer on the other side as described with respect to FIG. 7.

The embodiments of the invention described in the foregoing description are examples given by way of illustration and the invention is nowise limited thereto. Any modification, variation and equivalent arrangement as well as combinations of embodiments should be considered as being included within the scope of the invention.

REFERENCE NUMERALS

100 Solar cell
10 Substrate
11 Front contact layer
12 Window layer
13 Photoactive layer
131 First $CdSe_wTe_{1-w}$ layer
132 Second $CdSe_wTe_{1-w}$ layer
133 Third $CdSe_wTe_{1-w}$ layer
14 Back contact layer
141 Buffer layer
142 Metal layer
15 p-n junction
c1-c3 Amount of gaseous selenium in an annealing atmosphere
d1-d3 Thickness of a $CdSe_wTe_{1-w}$ layer
d11, d21, d31 Thickness of a CdSe layer d21, d22, d23 Thickness of a CdTe layer
$E_{g1}$-$E_{g3}$ Energy gap of a $CdSe_wTe_{1-w}$ layer
T1-T3 Annealing temperature
t1-t3 Time period of annealing
w, w1-w3 Amount of selenium in a $CdSe_wTe_{1-w}$ layer

The invention claimed is:

1. Method for forming a double-graded CdSeTe thin film comprising the steps:
   a) providing a base substrate,
   b) forming a first $CdSe_wTe_{1-w}$ layer having a first thickness d1 and a first amount w1 of selenium in it on the base substrate,
   c) forming a second $CdSe_wTe_{1-w}$ layer having a second thickness d2 and a second amount w2 of selenium in it on the first $CdSe_wTe_{1-w}$ layer, wherein the second amount w2 lies in the range between 0.25 and 0.4, and
   d) forming a third $CdSe_wTe_{1-w}$ layer having a third thickness d3 and a third amount w3 of selenium in it on the second $CdSe_wTe_{1-w}$ layer,
   wherein a maximum of the energy gap in the first $CdSe_wTe_{1-w}$ layer and a maximum of the energy gap in the third $CdSe_wTe_{1-w}$ layer are equal to or higher than 1.45 eV and the energy gap in the second $CdSe_wTe_{1-w}$ layer lies in the range between 1.38 eV and 1.45 eV and is smaller than the maximum of the energy gap in the first $CdSe_wTe_{1-w}$ layer and smaller than the maximum of the energy gap in the third $CdSe_wTe_{1-w}$ layer;
   wherein at least the first or the third $CdSe_wTe_{1-w}$ layer is formed using deposition of a layer of CdSe and/or a layer of CdTe and annealing the deposited layers,
   the first $CdSe_wTe_{1-w}$ layer is formed using consecutive deposition of a first layer of CdSe with a first thickness d11 and a second layer of CdTe with a second thickness d22 and annealing the deposited layers at a first temperature and under a first atmosphere for a first time period,
   the second $CdSe_wTe_{1-w}$ layer is formed using consecutive deposition of a second layer of CdSe with a third thickness d21 and a second layer of CdTe with a fourth thickness d22 and annealing the deposited layers at a second temperature and under a second atmosphere for a second time period, and
   the third $CdSe_wTe_{1-w}$ layer is formed using consecutive deposition of a third layer of CdSe with a fifth thickness d31 and a third layer of CdTe with a sixth thickness d32 and annealing the deposited layers at a third temperature and under a third atmosphere for a third time period,
   wherein the ratio of the respective thickness of the CdSe layer and the respective thickness of the CdTe layer is different for each of the first, the second and the third $CdSe_wTe_{1-w}$ layer.

2. Method according to claim 1, characterized in that at least the second $CdSe_wTe_{1-w}$ layer is formed using co-deposition of cadmium, selenium and tellurium and annealing the deposited layer under an atmosphere containing gaseous selenium.

3. Method according to claim 2, characterized in that:
   the first $CdSe_wTe_{1-w}$ layer is formed using co-deposition of cadmium, selenium and tellurium and annealing the deposited layer at a first temperature and under a first atmosphere containing a first amount c1 of gaseous selenium in it for a first time period,
   the second $CdSe_wTe_{1-w}$ layer is formed using co-deposition of cadmium, selenium and tellurium and annealing the deposited layer at a second temperature and under a second atmosphere containing a second amount c2 of gaseous selenium in it for a second time period, and
   the third $CdSe_wTe_{1-w}$ layer is formed using co-deposition of cadmium, selenium and tellurium and annealing the deposited layer at a third temperature and under a third atmosphere containing a third amount c3 of gaseous selenium in it for a third time period,
   wherein the first amount w1 and the third amount w3 are larger than zero and smaller than 1 and wherein all amounts c1 to c3 are higher than zero.

4. Method according to claim 1, characterized in that
   the base substrate comprises a front contact layer and a window layer,
   wherein the window layer forms a surface of the base substrate,
   the first $CdSe_wTe_{1-w}$ layer is formed on the window layer,
   a back contact layer is formed on the third $CdSe_wTe_{1-w}$ layer, and
   the third amount w3 is in relation with the first amount w1 and the second amount w2 so that the maximum of the energy gap in the third $CdSe_wTe_{1-w}$ layer is larger than the maximum of the energy gap in the first $CdSe_wTe_{1-w}$ layer and the maximum of the energy gap in the first $CdSe_wTe_{1-w}$ layer is larger than the energy gap in the second $CdSe_wTe_{1-w}$ layer.

5. Method according to claim 4, wherein the first thickness d1 is in the range of 1 nm to 100 nm and smaller than the third thickness d3 lying in the range of 10 nm to 1500 nm and the third thickness d3 is smaller than the second thickness d2 lying in the range of 50 nm to 2000 nm.

6. Method according to claim 1, characterized in that
   the base substrate comprises a back contact layer forming a surface of the base substrate,
   the first $CdSe_wTe_{1-w}$ layer is formed on the back contact layer,
   a layer stack comprising a window layer and a front contact layer is formed on the third $CdSe_wTe_{1-w}$ layer, wherein the window layer is formed adjacent to the third $CdSe_wTe_{1-w}$ layer, and
   the first amount w1 is in relation with the third amount w3 and the second amount w2 so that the maximum of the energy gap in the first $CdSe_wTe_{1-w}$ layer is larger than the maximum of the energy gap in the third $CdSe_wTe_{1-w}$ layer and the maximum of the energy gap in the third $CdSe_wTe_{1-w}$ layer is larger than the energy gap in the second $CdSe_wTe_{1-w}$ layer.

7. Method according to claim 6, wherein the first thickness d1 is in the range of 10 nm to 1500 nm and larger than the third thickness d3 lying in the range of 1 nm to 100 nm and the first thickness d1 is smaller than the second thickness d2 lying in the range of 50 nm to 2000 nm.

8. Method according to claim 1, characterized in that a dopant is inserted into at least one of the first, the second or the third $CdSe_wTe_{1-w}$ layer having an amount of selenium higher than 0.3.

9. Method according to claim 8, characterized in that the dopant is selected from the group of Zn, Mg and Mn and combinations thereof.

10. Method according to claim 8, characterized in that the dopant is inserted using co-deposition of the dopant for at least a part of the time of co-deposition of cadmium, selenium and tellurium during forming at least the second $CdSe_wTe_{1-w}$ layer using co-deposition of cadmium, selenium and tellurium.

11. Method according to claim 8, characterized in that the dopant is inserted using forming one or more layers of a composition of tellurium with the dopant within or adjacent to the layer stack comprising the first, the second and the third $CdSe_wTe_{1-w}$ layers.

12. Method according to claim 1, characterized in that a barrier layer is formed at least between the first and the second $CdSe_wTe_{1-w}$ layers or between the second and the third $CdSe_wTe_{1-w}$ layers, the barrier layer reducing the diffusion of selenium.

13. Method according to claim 12, characterised in that the barrier layer is a thin film comprising one of ZnO, MnO or MgO or combinations thereof and has a thickness in the range from 1 nm to 50 nm.

* * * * *